United States Patent
Masur et al.

(12) 
(10) Patent No.: US 6,305,070 B1
(45) Date of Patent: *Oct. 23, 2001

(54) PERFORMANCE OF OXIDE DISPERSION STRENGTHENED SUPERCONDUCTOR COMPOSITES

(75) Inventors: Lawrence J. Masur, Needham; Donald R. Parker, Randolph; Eric R. Podtburg, Natick; Peter R. Roberts, Groton; Ronald D. Parrella, Shrewsbury; Gilbert N. Riley, Jr., Marlborough; Steven Hancock, Worcester, all of MA (US)

(73) Assignee: American Superconductor Corporation, Westborough, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/731,302

(22) Filed: Oct. 15, 1996

(51) Int. Cl.[7] .................................................. H01L 39/24
(52) U.S. Cl. .............................. 29/599; 505/1; 505/121; 505/238
(58) Field of Search .................................. 505/121, 238, 505/1; 29/599

(56) References Cited

U.S. PATENT DOCUMENTS

| | | |
|---|---|---|
| 4,983,576 | 1/1991 | Hagino et al. . |
| 5,075,285 | 12/1991 | Flukiger . |
| 5,232,906 | 8/1993 | Yamamoto et al. . |
| 5,246,917 | 9/1993 | Hikata et al. . |
| 5,296,456 | 3/1994 | Shiga et al. . |
| 5,354,535 * | 10/1994 | Dorris et al. .......................... 505/433 |
| 5,384,307 | 1/1995 | Lay . |
| 5,625,332 | 4/1997 | Kamo et al. . |
| 5,914,297 * | 6/1999 | Gorski .................................. 505/510 |

FOREIGN PATENT DOCUMENTS

| | | |
|---|---|---|
| 0 499 049 A | 1/1992 | (EP) . |
| 0 554 681 A | 1/1993 | (EP) . |
| 0 627 773 A1 | 12/1994 | (EP) . |
| 03 166348 A | 7/1991 | (JP) . |
| WO 89/02656 | 3/1989 | (WO) . |

OTHER PUBLICATIONS

Kebler et al., *Journal of Alloys and Compounds*, "High critical currents in Bi(2223) tapes with Ag and hardened Ag sheaths" 195:511–514, 1993.

Parrell et al., *Advances in Cryogenic Engineering*, "The effect of sheath material and deformation method on the oxide core density . . . " 40:193–200, 1994.

Sandhage et al., *Journal of Metals*, "The oxide–powder–in–tube method for producing high current density BSCCO superconductors" 43(3):21–25, 1991.

Tenberink et al., presented at ASC'92 Chicago, USA, "Development of Technical High–Tc Superconductor Wires and Tapes" Aug. 23–28, 1992.

* cited by examiner

*Primary Examiner*—Carl J. Arbes
(74) *Attorney, Agent, or Firm*—Fish & Richardson P.C.

(57) ABSTRACT

The invention features high performing composite superconducting oxide articles that can be produced from OPIT precursors substantially without poisoning the superconductor. In general, the superconducting oxide is substantially surrounded by a matrix material. The matrix material contains a first constraining material including a noble metal and a second metal. The second metal is a relatively reducing metal which lowers the overall oxygen activity of the matrix material and the article at a precursor process point prior to oxidation of the second metal. The second metal is substantially converted to a metal oxide dispersed in the matrix during or prior to a first phase conversion heat treatment but after formation of the composite, creating an ODS matrix.

29 Claims, 2 Drawing Sheets

PERFORMANCE OF OXIDE DISPERSION STRENGTHENED SUPERCONDUCTOR COMPOSITES

The invention relates to composite superconducting oxide articles.

BACKGROUND OF THE INVENTION

Since their discovery, oxide superconductors based on copper oxides have been widely studied. A key property is that the materials exhibit superconductivity at high temperatures relative to their traditional metallic counterparts. In many applications, it is important for the superconducting oxides to be composed of substantially one phase and have critical current densities ($J_c$) that are high.

One family of oxide superconductors includes bismuth-strontium-calcium-copper-oxide compositions such as $Bi_2Sr_2CaCu_2O_{8-x}$ (BSCCO-2212; where x is a value that provides a $T_c$ of about 80K) and $Bi_2Sr_2Ca_2Cu_3O_{10-y}$ (BSCCO-2223; where y is a value that provides a $T_c$ of at least 100K). Of particular interest are compositions where bismuth is partially substituted by dopants such as lead (that is, (Bi,Pb)SCCO)

The oxide materials, being ceramics, are generally brittle and are difficult to process and manipulate. Composites of oxide superconducting materials contained in metal matrices, or metal sheaths, have mechanical and electrical properties that are improved relative to the oxide superconductors alone. The composites can be prepared in elongated forms such as wires and tapes by processes, such as the well-known powder-in-tube (PIT) process, that typically include a number of stages.

In the PIT process, first, a powder of a precursor to a superconductor is prepared. The precursor can be a single material or a mixture of materials. Second, a metal container (for example, a tube, billet or grooved sheet) is filled with the precursor powder. The metal container serves as a matrix, constraining the superconductor. Third, the filled container is deformed in one or more iterations (with optional intermediate annealing steps) to reduce the cross sectional area of the container in a draft reduction step. A number of filled containers (filaments) can be combined and surrounded by another metal matrix to form a multifilament article. Finally, the material is subjected to one or more deformation and phase conversion heat treatment cycles which together form the desired oxide superconductor from the precursor and helps the oxide superconductor grains align and grow to form the textured superconductor article.

If the precursor powder is composed of one or more oxides, the process is known more specifically as oxide-powder-in-tube (OPIT) processing. See, for example, Rosner, et al., "Status of superconducting superconductors: Progress in improving transport critical current densities in superconducting Bi-2223 tapes and coils" (presented at the conference 'Critical Currents in High Tc Superconductors', Vienna, Austria, April, 1992), and Sandhage, et al., "The oxide-powder-in-tube method for producing high current density BSCCO superconductors", Journal of Metals, Vol. 43, No. 3, 1991, pp. 21–25, all of which are incorporated herein by reference.

A method of preparing BSCCO superconducting materials, particularly lead-doped BSCCO, is described in U.S. Ser. No. 08/467,033 filed Jun. 6, 1995 and entitled "Processing of (Bi,Pb)SCCO Superconductor in Wires and Tapes," and U.S. Ser. No. 08/331,184 filed Oct. 28, 1994 and entitled "Production and Processing of (Bi,Pb)SCCO Superconductors," both of which are incorporated herein by reference. In particular, the composition of the precursor powder is controlled to improve processing of the precursor powder. One feature of the BSCCO-2223 processing path described in this patent application is that tetragonal BSCCO-2212 (T-2212) is thermally converted to orthorhombic BSCCO-2212 (O-2212) prior to formation of BSCCO-2223. The phases can be distinguished by their X-ray diffraction patterns and lattice parameters.

Texturing helps to increase $J_c$ of the article. Texturing can be accomplished by deformation (deformation-induced texturing; DIT) or by phase conversion heat treatments which cause, for example, sintering or partial melting and regrowth of desired superconducting phases (reaction-induced texturing; RIT). Certain superconducting oxides, particularly BSCCO-2223 require precursor deformation for adequate performance. Density and texture of the product is increased in the article by sequential repetition of the deformation (D) and phase conversion heat treatment, or sintering (S), steps "n" times (nDS). Typical processes are 1DS to 5DS. Multiple low reduction deformation steps are described, for example, in Hikata, et al., U.S. Pat. No. 5,246,917, incorporated herein by reference. A single high reduction deformation step which can be used in 1DS processes is described in U.S. Ser. No. 08/468,089 filed Jun. 6, 1995 and entitled "Simplified Deformation-Sintering Process for Oxide Superconducting Articles", incorporated herein by reference.

In all stages of processing, it is important to avoid the formation of undesirable secondary phases. The presence of secondary phases can disrupt DIT of the primary phase of the precursor powder, can lead to gas evolution and can induce melting during heat treatments.

The metal container, sheath, or matrix which holds the precursor powder prior to and during processing is typically composed of a noble metal such as silver, gold, platinum, and palladium, or an alloy substantially comprised of a noble metal. A noble metal is a metal which is substantially unreactive with the oxide superconductor or the precursor powder under processing and use conditions. Oxide dispersion strengthened (ODS) silver alloys have been used as matrix materials The silver alloy is exposed to an oxidizing atmosphere to generate the metal oxide dispersion in the matrix, thereby increasing the strength and hardness of the matrix. In general, when oxidation occurs through reaction with atmospheric oxygen, the outer portion of the article becomes harder than the center, decreasing the flexibility of the article. See, for example, Lay, U.S. Pat. No. 5,384,307, incorporated herein by reference. Lay co-oxidizes the matrix and the precursor during the step that forms the desired (final) oxide superconductor by heating the article in an oxidizing atmosphere of about 3 to 14 volume percent oxygen. One problem of this process is that the superconductor can be "poisoned" as the matrix and precursor compete for oxygen. In practice, small amounts of poisoning can drastically reduce $J_c$. Thus, many ODS silver-superconductor composites have lowered current carrying capabilities. U.S. Ser. No. 08/626,130 filed Apr. 5, 1996 and entitled "Oxygen Dispersion Hardened Silver Sheathed Superconductor Composites", incorporated herein by reference, describes one solution, but it requires metallic alloy precursors and cannot be practiced with oxide precursors. Since OPIT-based composites generally have good $J_c$ performance, it is desirable to find a readily manufacturable, non-poisoning OPIT processing route to high performing ODS superconducting composites.

SUMMARY OF THE INVENTION

We have discovered high performing composite superconducting oxide articles that can be produced from OPIT precursors substantially without poisoning the superconductor. In general, the superconducting oxide is substantially surrounded by a matrix material. The matrix material contains a first constraining material including a noble metal and a second metal. The second metal is a relatively reducing metal which lowers the overall oxygen activity of the matrix material and the article at a precursor process point prior to oxidation of the second metal. Typically, the precursor article includes a precursor oxide mixture substantially surrounded by a first constraining material. In a preferred embodiment, a second constraining material substantially comprised of a noble metal or its alloy is included between the precursor oxide material and the first constraining material.

The processing sequence includes two or more phase conversion heat treatments by which the precursor oxide mixture is converted to the desired superconducting oxide, either directly or through one or more intermediate phase conversions. Between heat treatments, the article is deformed to texture the oxide mixture. The second metal is substantially converted to a metal oxide dispersed in the matrix during or prior to the first phase conversion heat treatment but after formation of the composite, creating an ODS matrix. Thereafter, the precursor oxide mixture is substantially converted to the desired superconducting oxide in one or more subsequent phase conversion heat treatments with intermediate deformation In one embodiment, the precursor oxide mixture is partially reduced during the first of these heat treatments, in which the second metal can be oxidized.

The first heating step includes an oxidizing heat treatment step in which the second metal is substantially oxidized prior to or concurrent with a first phase conversion heat treatment step. The oxidizing heat treatment can be a separate step. In some embodiments, the oxidizing heat treatment is a stepped or ramped portion of the first phase conversion heat treatment. In still others, the oxidizing and first phase conversion steps occur concurrently.

In another aspect, the invention features a method of manufacturing a composite superconducting oxide article by providing a precursor article including a precursor oxide mixture containing a dominant amount of a first precursor oxide phase which is substantially surrounded by a first constraining material including a noble metal and a second metal, heating the precursor article in a first phase conversion heat treatment at a processing temperature and oxygen partial pressure cooperatively selected to convert up to about 85 percent, preferably up to about 50 percent, most preferably between about 20 and 40 percent, of the first precursor oxide phase to the desired superconducting oxide and substantially completely converts the second metal to a metal oxide, deforming the precursor article to generate texture, and, thereafter, heating the precursor article in one or more subsequent phase conversion heat treatments to convert substantially all of the remainder of the precursor to the desired superconducting oxide.

In another aspect, the invention features a method of manufacturing a composite superconducting oxide article by heating a precursor article in a first phase conversion heat treatment at a processing temperature and oxygen partial pressure cooperatively selected to form a dominant amount of an orthorhombic BSCCO phase, deforming the precursor article to generate texture, and heating the textured precursor article in at least one subsequent phase conversion heat treatment to obtain the desired superconducting oxide. The article can benefit from redox processes between the matrix and a precursor oxide mixture in the first phase conversion heat treatment. The precursor oxide mixture contains a dominant amount of a tetragonal BSCCO phase and the first constraining material includes a noble metal and a reducing metal The orthorhombic BSCCO phase can be formed in part by reducing the precursor oxide mixture with the reducing metal. In the process, the reducing metal can be oxidized by the precursor oxide mixture to form metal oxide particles dispersed in the first constraining material. In preferred embodiments, the method includes the step of roll working the precursor article in a high reduction draft of between about 40 to 95 percent prior to the sintering step.

In another aspect, the invention features a method of manufacturing a composite superconducting oxide article by providing a precursor article including a precursor oxide mixture substantially surrounded by a matrix including a first constraining material including a noble metal and a second metal, heating the precursor article to form less than about 0.5 volume percent of metal oxide particles of the second metal dispersed in the first constraining material, and sintering the heated article to obtain the superconducting oxide article.

In another aspect, the invention features a method of manufacturing a composite superconducting oxide article by providing a precursor article including a precursor oxide mixture substantially surrounded by a matrix including a first constraining material which includes a noble metal and a second metal, heating the precursor article to form less than about 0.3 volume percent of metal oxide particles of the second metal dispersed in the matrix, and sintering the heated article to obtain the superconducting oxide article.

In preferred embodiments, the article has a tensile strength greater than about 50 MPa.

In another aspect, the invention features a composite superconducting article which contains a plurality of filaments extending along the length of the article, where the filaments are composed, in part, of an oxide superconductor. A first constraining material substantially surrounds the plurality of filaments and a second constraining material substantially surrounds each of the filaments and is substantially surrounded by the first constraining material. The filaments can have substantially the same critical current density regardless of the location of each filament in the article. In preferred embodiments, the first constraining material includes a noble metal and a metal oxide and the second constraining material contains a noble metal. In other preferred embodiments, an outermost constraining material substantially surrounds the first constraining material, and contains a noble metal. In this embodiment, the outermost constraining material can include a noble metal, a noble metal and a reducing metal, or a noble metal and a metal oxide. In preferred embodiments, the outermost constraining material is silver.

In another aspect, the invention features a composite superconducting article including an oxide superconductor substantially surrounded by a first constraining material where the first constraining material includes a noble metal and less than about 0.5 volume percent of a metal oxide. In another aspect, the volume percent of the metal oxide is measured across the total cross-sectional area of the matrix by omitting the areas corresponding to the superconducting oxide from the cross section. In yet another preferred embodiment, the metal oxide particles dispersed in the constraining materials occupy less than 0.3 percent of the volume of the matrix. More preferably, the metal oxide particles occupy between 0.001 and 0.3 percent of the volume of the matrix, and most preferably at least 0.005. The matrix can have relatively metal oxide rich and metal oxide poor regions and these percentages are calculated as the average over all regions of the matrix.

In other aspects, the invention features a composite superconducting article including one or more filaments extending along the length of the article. The filaments include an oxide superconductor. A first constraining material substantially surrounds the plurality of filaments. A second constraining material substantially surrounds each of the filaments and is substantially surrounded by the first constraining material. The first constraining material includes a noble metal and less than about 0.5 volume percent of a metal oxide and the second constraining material includes a noble metal.

In preferred embodiments, the noble metal includes silver, gold, platinum, or palladium or their alloys and the reducing metal, metal of the metal oxide, or second metal is aluminum, magnesium, lithium, sodium, potassium, calcium, beryllium, strontium, barium, yttrium, scandium, lanthanum, cerium, praseodymium, neodymium, promethium, samarium, europium, gadolinium, terbium, dysprosium, holmium, erbium, thulium, ytterbium, lutetium, titanium, zirconium, hafnium, vanadium, niobium, tantalum, silicon, germanium, tin, lead, gallium, indium, thallium, manganese, antimony, or zinc. More preferably, the reducing metal, metal of the metal oxide, or second metal is aluminum, magnesium, yttrium, zirconium, titanium, hafnium, lithium, manganese, antimony, or zinc. In preferred embodiments, the reducing metal forms a solid solution with the noble metal.

The article can contain from 1 to 10,000 filaments. In preferred embodiments, the composite superconducting articles can have a plurality of oxide superconductor filaments. Most preferably, the multifilament article can contain from 5 to 1,000 filaments The invention can be practiced with any micaceous or semi-micaceous superconducting oxide. Grains of these materials tend to align during deformation and so are particularly well suited to texturing by "DS " processes. Members of the bismuth family of superconducting copper oxides are particularly preferred.

In certain embodiments, the tetragonal BSCCO phase is tetragonal BSCCO-2212, the orthorhombic BSCCO phase is orthorhombic BSCCO-2212 and the desired superconducting oxide is BSCCO-2223. Preferably, the tetragonal BSCCO phase is tetragonal (Bi,Pb)SCCO-2212, the orthorhombic BSCCO phase is orthorhombic (Bi,Pb)SCCO-2212 and the desired superconducting oxide is (Bi,Pb)SCCO-2223. The desired superconducting oxide can be orthorhombic BSCCO-2212 or orthorhombic (Bi,Pb)SCCO-2212.

The invention may provide one or more of the following advantages. The use of multiple phase conversions provides a better textured product. Intermediate deformations also improve texture, and the relatively low loading of oxide during deformation improves formability as well as reduces edge cracking. The presence of the second metal in the matrix can lower the oxygen activity within and throughout the material allowing better control of the oxidation reactions. Previous methods relied on the diffusion of oxygen from the precursor oxide mixture to the atmosphere. The second metal can provide a "sink" for the oxygen, eliminating the need for the oxygen to diffuse completely out of the article during processing. Relatively low loadings of reducing materials can help balance these reactions for controlled phase conversion. ODS-strengthened composites exhibit better mechanical properties. ODS formation prior to deformation also helps promote densification of the filaments, which mechanically accelerates reaction process because the increased filament density can shorten heat treatment times. The articles produced can also have increased critical current densities ($J_c$ or Je).

It is possible to use a complete reducing matrix material where the precursor oxide powder is in direct contact with unoxidized matrix alloys.

"Article," as used herein, means a wire, tape, current lead, or cable, and devices fabricated from these. The wire and tape can have more than one type of filament. The article can contain a single oxide superconductor filament (monofilament) or a plurality of oxide superconductor filaments (multifilament).

"Matrix" means the material surrounding the oxide superconductor filament or filaments in the article. The amount of matrix material can be measured by omitting the areas corresponding to the superconducting oxide filaments from the total cross section of the article.

"Predominantly" or "dominant amount," as used herein, mean at least 50 percent, preferably at least 90 percent and most preferably at least 95 percent of the desired phase is present by volume.

"Phase modification," or "phase conversion," means to alter the crystalline phase of the precursor oxide mixture from one form to another. For example, tetragonal BSCCO-2212 is phase modified to orthorhombic BSCCO-2212, or BSCCO-2212 is phase modified to BSCCO-2223.

"Phase conversion heat treatment," as used herein, means a heat treatment by which some portion of the precursor oxides are phase converted into the desired oxide superconductor or a desirable intermediate phase.

"Undesirable secondary phase," as used herein, means a phase (or phases) in the precursor powder or superconducting oxide that hinders conversion of the precursor powder into the superconducting oxide, or hinders texturing of the superconducting oxide.

"T to O conversion" means the induction of a phase change from a tetragonal to an orthorhombic phase.

"$J_c$," the critical current density, means the current of the superconducting article normalized by the cross-sectional area of the oxide superconductor in the article. "Je," the engineering current density, means the current of the superconducting article normalized by the total cross-sectional area of the article.

Other features and advantages of the invention will be apparent from the description of the preferred embodiment thereof, and from the claims.

DESCRIPTION OF THE PREFERRED EMBODIMENTS

Figure 1:
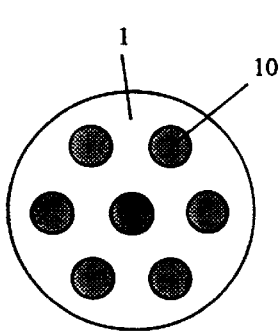
FIG. 1 is a drawing depicting a cross-sectional view of a composite precursor of a reducing matrix surrounding precursor oxide filaments.

The superconducting articles of interest are composite materials where a superconducting oxide is contained by a metal matrix material. The matrix material includes a first constraining material and, optionally, other constraining materials. By including a second metal that can be oxidized in the metal matrix composition to form a dispersion, improved article performance can be obtained and the method of forming the final superconducting articles can be modified. The dispersion need not be uniform, but discrete, small metal oxide particles are formed during the oxidation that preferably have diameters less than about 100 nm. The oxidation of the second metal takes place after formation of the composite but before substantial phase conversion of the dominant amount of the precursor oxide to the desired superconducting oxide. Relatively low levels of the second metal are used, typically less than about 0.3 percent measured over the entire matrix volume so that significant levels of deformation can be performed on the composite after oxidation of the second metal.

In standard BSCCO-2223 processing at higher levels with late oxidation, the ill effects of redox due to ODS have been demonstrated. The conditions of heat treatment were such that the BSCCO-2212, and perhaps other oxides, near the matrix alloy were reduced causing the phase assemblage to change. This resulted in the disruption of the formation of the dense BSCCO-2223 layer at the interface and the creation of second phases that spike and extend outside the desired oxide filaments. However, use of reducing matrices in accordance with the invention results in the formation of higher $J_c$ articles since reduction of the precursor oxide can be a fundamental part of the initial phase conversion process or at a minimum, part of a non-competing sequence. The early oxidation step provides a situation where the oxidation of the silver alloy and consequent reduction of the precursor oxide cores is no longer disruptive to the formation of the dense BSCCO-2223 layer at the silver interface. The method of forming superconducting articles involves composite materials including a precursor oxide mixture and a metal matrix that is, at least in part, reducing. The reducing portion of the metal matrix can be a noble metal alloy with a second metal.

The typical process begins with a metal constraining material that is packed with a precursor oxide powder mixture. For example, the process can be an OPIT process where the metal constraining material can be a metal billet. In this case, the precursor oxide mixture is a mixture of raw materials in a ratio of metallic constituents corresponding to a final superconducting BSCCO, (Bi,Pb)SCCO, or BSCCO-2223 material.

The packed billet is deformed into filament form. Filaments can then be arranged, or grouped, in a metal container to form a multifilament article precursor. The metal billet and the metal container are composed of a noble metal, such as silver, for example, and can include a second metal that is reducing in the form of a noble metal alloy. During or prior to a first phase conversion heat treatment step, but after formation of the composite, the reducing component of the matrix is oxidized by heat treatment to create a strengthening dispersion of metal oxide particles in the matrix. The oxidizing heat treatment can be a separate step. In some embodiments, the oxidizing heat treatment is a stepped or ramped portion of the first phase conversion heat treatment. In still others, the oxidizing and first phase conversion steps occur concurrently The separate oxidation step preferably takes place at about 250–650° C. in about 0.1 to 100 atm. $O_2$ for a time sufficient to substantially oxidize the second metal, typically about 1 to 10 hours. Ramped or stepped treatments preferably take place at comparable conditions, with ramps or steps through the 250–650° C. range slow enough to obtain substantial oxidation typically 0.5–6° C./min. The reducing matrix can affect the mechanism of forming the final superconducting article by changing the fate of at least some of the oxygen in the precursor mixture. At least a partial phase conversion of the precursor oxide occurs during the first phase conversion heat treatment step. Thereafter, the composite is subjected to at least one cycle of deformation followed by phase conversion heat treatment (a "DS" cycle) to texture and form the desired superconducting oxide.

Use of ODS strengthened matrices in superconducting composites requires a balance of materials properties to simplify processing while maintaining or increasing performance. In superconducting article processing steps that employ deformation texturing, it is important to balance the hardness of the ODS sheath with its malleability by adjusting the volume percentage of the second metal. While strength of the material is important and a harder sheath can produce superior texturing during deformation, it is equally important that the materials be sufficiently malleable for deformation processing, particularly in high reduction pass processes. The sheath cannot be too brittle to withstand the deformation or cracking may result. It is important to balance the mechanical properties of the materials to facilitate processing while maximizing the electrical properties. The ODS sheathing promotes densification of the superconducting oxide within the composite during deformation and phase conversion. Denser filaments have been associated with improved product performance.

The nature of the second metal is important. The second metal is typically easy to oxidize relative to the noble metal. It is preferred that the second metal be soluble in the noble metal such that the metal matrix is a homogenous alloy. The noble metal can include silver, gold, platinum, or palladium, or an alloy of these metals (with each other). The second metal, or metal of the dispersed metal oxide, is selected from the group including elemental aluminum, magnesium, lithium, sodium, potassium, calcium, beryllium, strontium, barium, yttrium, scandium, lanthanum, a lanthanide series element (e.g., cerium, praseodymium, neodymium, promethium, samarium, europium, gadolinium, terbium, dysprosium, holmium, erbium, thulium, ytterbium, or lutetium), titanium, zirconium, hafnium, vanadium, niobium, tantalum, silicon, germanium, tin lead, gallium, indium, thallium, and zinc. More preferably, the second metal is aluminum, magnesium, yttrium, zirconium, titanium, hafnium, lithium, manganese, antimony, or zinc. Most preferably, the second metal, or metal of the dispersed metal oxide, is aluminum, magnesium, zirconium, antimony, or manganese.

Relatively low levels of metal oxide dispersed in the metal matrix, particularly less than about 0.3 volume percent of metal oxide, preferably 0.001 to about 0.3 volume percent, lead to higher current densities (Je) in composites while maintaining sufficiently high tensile strengths. The metal oxide particles formed during the oxidation preferably have diameters less than 100 nm. Composites can be tailored to have relatively oxide rich and oxide poor regions to further improve performance. The Je of composites having a silver second constraining material around the oxide superconductor surrounded by an ODS first constraining material containing less than 0.5 volume percent of metal oxide can exceed 8,500 A/cm$^2$.

The relationships between the volume percent of the metal oxide, and the weight percent and atomic percent of the source alloy in silver for a number of metal oxides are summarized in Table 1.

TABLE 1

| | | | 0.30 vol % metal oxide | |
| --- | --- | --- | --- | --- |
| Element | Oxide | Density | wt % second metal | at % second metal |
| Li | Li$_2$O | 2.013 | 0.027 | 0.413 |
| Mg | MgO | 3.58 | 0.062 | 0.277 |
| Al | Al$_2$O$_3$ | 3.97 | 0.061 | 0.241 |
| Si | SiO$_2$ | 2.65 | 0.036 | 0.137 |
| Sc | Sc$_2$O$_3$ | 3.864 | 0.073 | 0.174 |
| Ca | CaO | 3.35 | 0.069 | 0.186 |
| Ti | TiO$_2$ | 4.26 | 0.074 | 0.165 |
| V | V$_2$O$_3$ | 4.87 | 0.096 | 0.202 |
| Zr | ZrO$_2$ | 5.89 | 0.126 | 0.149 |
| Ce | CeO$_2$ | 7.132 | 0.169 | 0.129 |
| Mn | Mn$_3$O$_4$ | 4.856 | 0.101 | 0.198 |
| Cu | CuO | 6.5 | 0.150 | 0.252 |
| Sr | SrO | 4.7 | 0.115 | 0.141 |
| Y | Y$_2$O$_3$ | 5.01 | 0.114 | 0.138 |
| In | In$_2$O$_3$ | 1.179 | 0.028 | 0.026 |
| Sn | SnO$_2$ | 6.95 | 0.158 | 0.144 |
| Sb | Sb$_2$O$_4$ | 5.82 | 0.133 | 0.118 |
| Th | ThO$_2$ | 9.86 | 0.250 | 0.117 |
| La | La$_2$O$_3$ | 6.51 | 0.160 | 0.125 |

Forming Superconducting Articles by Redox Processes

The phase contents of the precursor oxide mixture are modified during the heat treatment prior to deformation. Phase modification includes conversion of a portion of the oxide precursor from one form to another. Phase modification includes conversion from tetragonal BSCCO-2212 to orthorhombic BSCCO-2212, or from BSCCO-2212 to BSCCO-2223 plus secondary phases. Phase modification also includes modification of a particular phase without conversion into a distinct phase. For example, the oxygen content or dopant level of the phase can be changed. Modifications also include changes in secondary phases.

After the initial phase transformation prior to deformation, the article is subjected to one or more subsequent phase conversion heat treatments with intermediate deformations to achieve the final BSCCO-2223 superconducting article.

In a preferred embodiment, the precursor powder contains oxides in the stoichiometric proportions necessary to obtain BSCCO-2223. Some of these oxides can be complex oxides such as BSCCO-2212. The precursor powder is converted to BSCCO-2223 by at least two phase conversion heat treatments with intermediate texturing deformations. The second metal can be oxidized during the first phase conversion heat treatment. Oxygen release from the formation of BSCCO-2223 and secondary phases can play a role in the oxidation of the second metal. However, it is important that the metal oxide loading be kept relatively low (to less than about 0.5 volume percent of the particular constraining material in which the second metal is dispersed or less than about 0.3 volume percent of the entire matrix) and that the oxidation reaction be completed before a dominant amount of the BSCCO-2223 has been formed in order to maximize the beneficial effects of the redox reactions and minimize the risk of poisoning. Typically, the oxidation reaction is completed by the end of the first phase conversion heat treatment. The phase conversion heat treatments preferably take place at 780–850° C. in nitrogen atmospheres with 0.03–0.21 PO$_2$ for sufficient times to obtain the desired reaction levels, typically 2–40 hours each for a sequence of 3 heat treatments with two intermediate deformations. Deformations of 3 to 40 percent in one or more drafts are typical In a particular embodiment, the precursor metal powder preferably contains a dominant amount of T-2212 or a mixture that reacts to form T-2212. The phase modifications which occur during heat treatment prior to texture inducing deformation are described in U.S. Ser. No. 08/467,033 and U.S. Ser. No. 08/331,184, noted above. Preferred precursor oxide compositions include T-2212 and calcium plumbate (Ca$_2$PbO$_4$). The final critical current density of a superconducting BSCCO-2223 article is improved when the article is subjected to heat treatment which promotes conversion of T-2212 to O-2212 prior to DIT. The heat treatment is carried out under conditions where O-2212 is stable. Typically, O-2212 is favored at lower temperatures and oxygen partial pressures than T-2212. The heating step preferably includes maintaining the temperature between 600 and 850° C. and the PO$_2$ between 10$^{-5}$ and 0.21 atm. During the conversion, the second metal component of the matrix can be oxidized as a result of the oxygen release from the T to O reaction. The process of including the second metal component in the matrix can decrease the amount of gas diffusion necessary to convert the T-2212 to O-2212. In so doing, the uniformity of the resulting article is increased. In the absence of a reducing matrix material, oxygen diffusion out of the article was relied upon alone to drive the T to O conversion. As a result, the precursor oxide mixture near the outside of the article converted long before precursor oxide material farther away from the outside of the article. In order to convert material within the article without a reducing matrix, the precursor oxide near the surface was "over-reacted," leading to growth of undesirable secondary phases. After T to O conversion, the article precursor experiences a high reduction draft in the rolling step. Preferably, the rolling draft is between 40 and 95 percent. The SPR introduces texture into the superconducting phase.

In any embodiment, whether or not redox processes are employed the low concentration of ODS facilitates successful deformation, which is particularly useful in obtaining high performing BSCCO-2223 composites. Due to the low concentration of ODS in the matrix, the matrix should not be particularly brittle. In ODS silver composites, when the content of metal oxide dispersed in the matrix is less than 0.3 volume percent, materials strength, brittleness, and current density are well balanced.

Article Precursor Configurations

There are a number of article precursor configurations that can be applied using the reducing matrix material approach to forming superconducting articles. Among the possible advantages of the structures is the potential for more uniform phase formation across the cross section of the article. The articles can also have increased strength and ductility over articles made by other methods. The number of filaments shown in the described figures are examples only and are not intended to be limiting in scope of the invention.

A number of filaments of superconducting oxide can be supported in various matrices to yield multifilament articles. For example, in FIG. 1 a cross section of a multifilament superconducting article is shown in which a matrix 1 contains filaments 10 of a superconducting oxide or precursor oxide. The filaments can be located anywhere in the cross section since diffusion of oxygen out of the precursor article need not be a limiting step in the processing. The matrix can be, for example, a silver alloy containing aluminum, magnesium, yttrium, titanium or their oxides.

Figure 2:
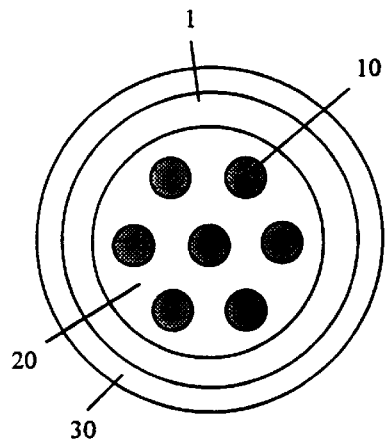
FIG. 2 is a drawing depicting a cross-sectional view of a composite precursor including an outermost constraining material and a first constraining material surrounding a second constraining material containing precursor oxide filaments.

A cross section of a precursor article configuration which is particularly preferred is shown in FIG. 2. In this configuration, first constraining material 1 surrounds superconducting oxide filaments 10 and second constraining material 20. In certain preferred embodiments, outermost constraining material 30 surrounds first constraining material 10. In this structure, the second constraining material preferably does not have a reducing metal component and can simply be a noble metal (for example, silver). The outermost constraining material is preferably silver or silver alloy, although other metals can be used. The silver outermost constraining member provides fewer ruptures and better surface quality, while the oxide-depleted inner region 20 provides better controlled, more uniform phase conversions and lower risk of poisoning.

The ODS matrix on the outside of the article results in strengthened (oxidized) matrix material near the superconducting oxide surrounded by less oxidized matrix material outside. The matrix will be softer and more malleable on the exterior. As a result, the article can have greater ductility and greater strength than typical HTS products which have tensile strengths of less than about 45 MPa.

Figure 3:
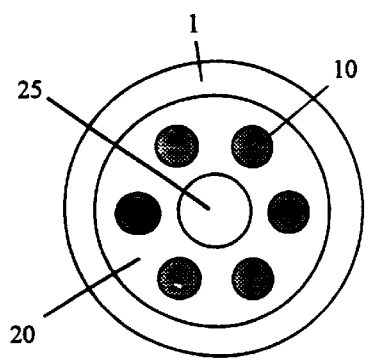
FIG. 3 is a drawing depicting a cross-sectional view of a composite precursor including a first constraining material surrounding a second constraining material containing precursor oxide filaments and a core of a reducing material.

A third cross section of a precursor article is shown in FIG. 3. In this structure, the first constraining material surrounds superconducting oxide filaments 10, the second constraining material 20, and a reducing core 25. The reducing core can be composed of the same reducing material as the first constraining material or it can include different metals. In this configuration, the superconducting oxide filaments can encounter the same relatively reducing environment regardless of their location in the article.

Figure 4:
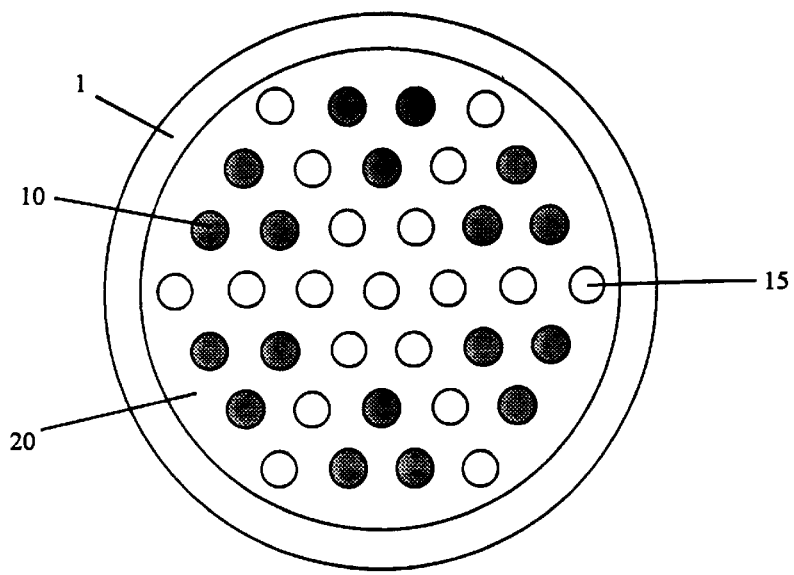
FIG. 4 is a drawing depicting a cross-sectional view of a composite precursor including a first constraining material surrounding a second constraining material containing precursor oxide filaments and reducing filaments.

The fourth configuration is shown in cross section in FIG. 4. In this structure, first constraining material 1 surrounds superconducting oxide filaments 10, reducing filaments 15, and second constraining material 20. The reducing filaments can be composed of the same material as the first constraining material, or it can include different second metals. The superconducting oxide filaments in this configuration experience largely the same environment in the article due to the dispersion of reducing filaments in the matrix.

Figure 5:
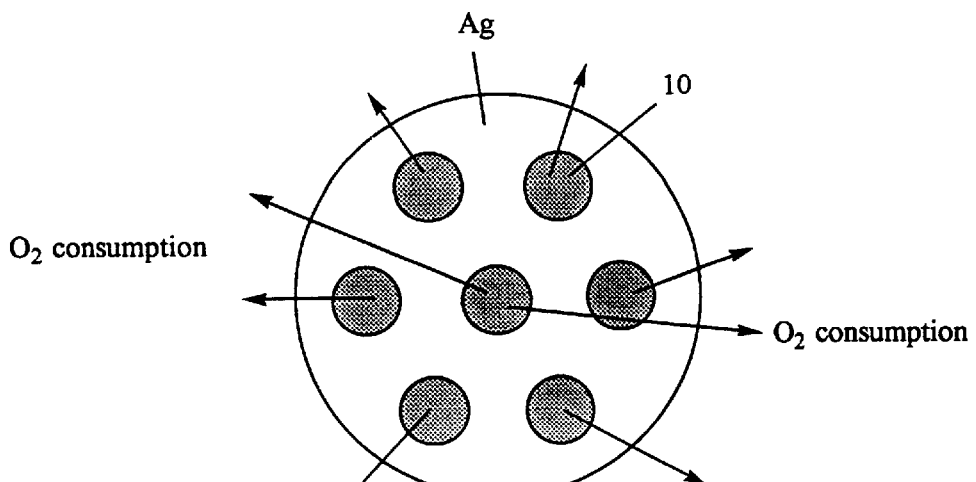
FIG. 5 (prior art) is a schematic drawing depicting the mechanism of oxygen removal from a silver matrix article.
Figure 6:
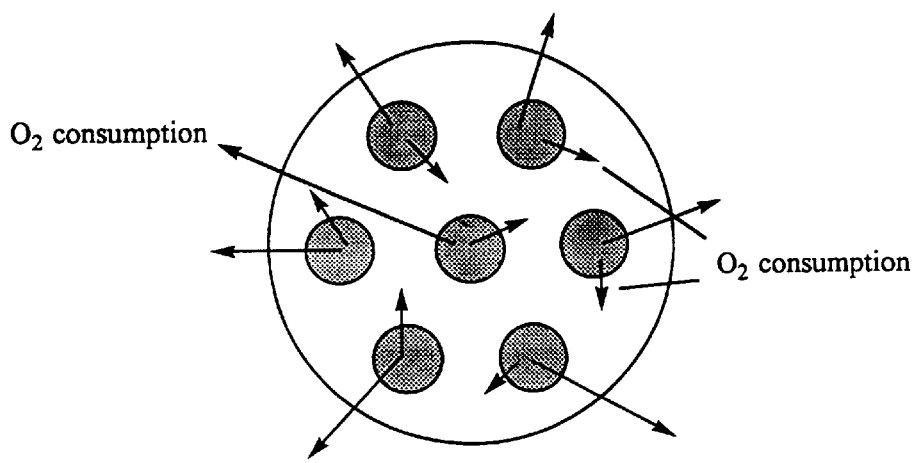
FIG. 6 is a schematic drawing depicting the mechanism of oxygen removal from a reducing matrix article of the structure described in FIG. 1.
Figure 7:
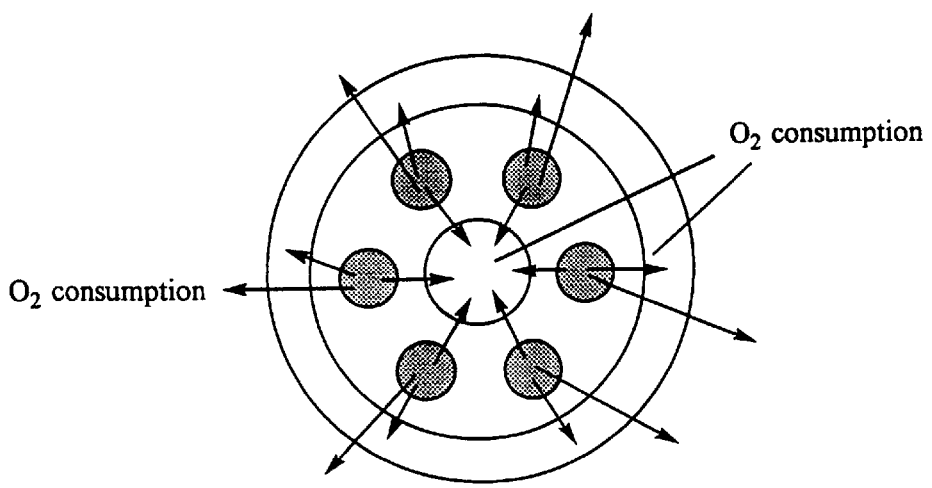
FIG. 7 is a schematic drawing depicting the mechanism of oxygen removal from an article of the structure described in FIG. 3.

The effect of the reducing materials on the redox mechanism during phase conversion is illustrated in FIGS. 5–7. Referring to FIG. 5, prior art compositions in which precursor oxide filaments 10 are surrounded by a silver (Ag) matrix, for example, relied on oxygen diffusion out of the article into the atmosphere Arrows depict the directions of oxygen ($O_2$) diffusion out of the material. Clearly, the central filament in this example will take longer to convert than the outer filaments since the oxygen must travel through more material to be consumed.

In FIG. 6, oxygen diffusion in the precursor article having a reducing matrix described in FIG. 1 is shown. In this situation, the oxygen needs only to diffuse out of the precursor oxide filament into the matrix to be consumed. Hence, the conversion rate of the precursor oxide may be increased since the oxygen only needs to diffuse a short distance. In addition, the conversion of the filaments can occur at largely the same rate since the outer filaments and the central filaments experience similar reducing environments.

In FIG. 7, oxygen diffusion in the precursor article having a reducing sheath and a reducing core described in FIG. 3 is shown. In this configuration, the oxygen diffuses through the intermediate matrix region to the reducing core or to the reducing sheath to be consumed. Again, the precursor oxide filaments are more homogeneously converted due to the proximity of the reducing elements.

Articles prepared from the reducing matrix process have increased tensile strengths over traditionally processed articles. Furthermore, by selecting the proper $PO_2$, a wire can be made where the hardest matrix material is near the filaments and the softest material is near the outside; or the other way around. The matrix properties can be modified in a controlled way to provide better uniformity for the oxide cores and denser oxide cores. The microhardness of the inside of the matrix is higher than the external surface of the matrix (oxidized in 0.001 atm oxygen) since the dispersed oxide is formed there.

The specific examples set forth below are to be construed as merely illustrative, and not limitative of the remainder of the disclosure in any way whatsoever.

EXAMPLE 1

A mixture of Bi, Pb, Sr, Ca, and Cu nitrates with metal ratios of 1.74:0.34:1.91:2.03:3.07 was calcined at 650° C. for 0.25–1.5 hours. The calcined mixture was ground to reduce the particle size of the oxide powder. The powder was heated in air at 780–830° C. for 6–10 hours and finally heat treated in pure oxygen at 780–830° C. for 6–10 hours, forming tetragonal BSCCO-2212, $Ca_2PbO_4$, and CuO phases. The powder was packed into pure silver billets having a 1.235 inch (3.14 cm) outer diameter and 0.906 inch (2.3 cm) inner diameter. The loaded billets were drawn to hexagonal monofilament wires of 0.07 inch diameter (0.18 cm). The wires were cut into two sets of 85 equal filament pieces.

Wire A was bundled into a silver tube with a 0.84 inch (2.13 cm) outer diameter and 0.76 inch (1.93 cm) inner diameter. Wire B was bundled into an ODS precursor (0.09 weight percent aluminum in silver) tube of the same dimensions. The bundled 85 filament tubes were each drawn down to round wires of 0.136 inch (3.45 mm) diameter. When anneals were needed, the filaments were heated to between 200 and 400° C. for 30 to 300 minutes in a nitrogen atmosphere. The wires were then given a rectangular shape by use of Turk's Head to a cross section 0.072 inches (1.83 mm) thick by 0.130 inches (3.30 mm) wide. Both wires were further deformed on a rolling mill into 0.0113 inch (0.287 mm) thick tapes. At this point an iterative sinter-deform process was applied to convert the BSCCO-2212 into (Bi, Pb)SCCO-2223. The sinter-deform process consisted of the following steps:

1. Heat treating the wire in a 1 to 21 percent oxygen atmosphere at between 790 and 850° C. for between 1 and 100 hours.
2. Deforming the wire on a rolling mill to a diameter of 0.0086 inches (0.218 mm),
3. Heat treating the wire in a 1 to 21 percent oxygen atmosphere at between 790 and 850° C. for between 1 and 100 hours.
4. Deforming the wire on a rolling mill to a diameter of 0.0075 inches (0.191 mm).
5. Heat treating the wire in a 1 to 21 percent oxygen atmosphere at between 790 and 850° C. for between 10 and 100 hours, and at between 650 and 790° C. for between 10 and 100 hours.

After the first heat treatment, up to 50 percent of the precursor oxide was converted to BSCCO-2223. Maximum Je values (average Je of eight samples) and the corresponding heat treatment dwell times are listed in Table 2. The ODS bundling tube in this process allows shorter heat treatment dwell times to be used while increasing Je. Hence, the total preliminary heat treat time to reach the peak critical current density decreases while the maximum critical current density achievable increases. In the most direct comparison, under the same reaction conditions and dwell times and involving two wires made from the exact same powder lot, the Je attained increased from 5,890 A/cm$^2$ for the silver sheath to 8,290 A/cm$^2$ for the ODS sheath.

TABLE 2

| Wire | Bundling Tube | 1st Heat Treatment | 2nd Heat Treatment | Je (A/cm$^2$) |
| --- | --- | --- | --- | --- |
| A | Ag | 8 hours | 16 hours | 6,530 |
| A | Ag | 4 hours | 10 hours | 5,890 |
| B | ODS | 4 hours | 10 hours | 8,290 |

EXAMPLE 2

A separate iterative sinter-deform process was applied to samples from Wire B of Example 1 to investigate the effect of oxidizing the ODS prior to the first high temperature heat treatment. The process consisted of the following steps:

1. Pre-oxidation heat treatment in a 1.0 atm oxygen atmosphere at 450° C. for 5 hours.
2. Heat treating the wire in a 1 to 21 percent oxygen atmosphere at between 790 and 850° C. for between 1 and 100 hours.
3. Deforming the wire on a rolling mill to a diameter of 0.0086 inches (0.218 mm).
4. Heat treating the wire in a 1 to 21 percent oxygen atmosphere at between 790 and 850° C. for between 1 and 100 hours.
5. Deforming the wire on a rolling mill to a diameter of 0.0075 inches (0.191 mm).
6. Heat treating the wire in a 1 to 21 percent oxygen atmosphere at between 790 and 850° C. for between 10 and 100 hours, and at between 650 and 790° C. for between 10 and 100 hours.

The data shown in Table 3 indicate that the Je of the wires are substantially independent of the conditions used to oxidize the metal to form the metal oxide in the ODS.

TABLE 3

| Wire | Bundling Tube | 1st Heat Treatment | 2nd Heat Treatment | Je (A/cm$^2$) |
| --- | --- | --- | --- | --- |
| B | ODS | Pre-oxidation followed by 3 hours | 8 hours | 7,790 |
| B | ODS | 4 hours | 8 hours | 7,840 |

EXAMPLE 3

The oxide powder was prepared by an iterative calcine and grind process as described in Example 1. The resulting powders were of the nominal stoichiometry of 0.34 Pb:1.74 Bi: 1.91 Sr:2.03 Ca:3.07 Cu, forming tetragonal BSCCO-2212, Ca$_2$PbO$_4$, and CuO phases. The powder was packed into pure silver billets having a 1.235 inch (3.14 cm) outer diameter and 0.906 inch (2.3 cm) inner diameter. The loaded billets were drawn to hexagonal monofilament wires of 0.07 inch diameter (0.18 cm). The wires were cut into filament pieces.

The multifilament tapes were made by the following procedure. First, the filaments were bundled into a 0.09 weight percent aluminum in silver tube having an outer diameter of 0.840 inches and an inner diameter of 0.760 inches. The bundles were then drawn to a final diameter of 0.0354 inches. When anneals were needed, the filaments were heated to between 200 and 400° C. for 30 to 300 minutes in a nitrogen atmosphere.

The first phase conversion heat treatment of the drawn wires was carried out in a box furnace and an atmosphere of between 0.01 and 3 percent oxygen in argon. The heat treatment profile was: (1) an optional hold at 100 to 350° C. for 1 to 5 hours to purge the furnace; (2) ramp to 750 to 800° C. and hold for 1 to 10 hours to oxidize the aluminum during the T to O phase conversion; and (3) cool to room temperature.

The wires were then rolled to a dimension of 0.0075 inches.

If two or more second phase conversion heat treatments were done, the process was as follows: (1) the wires were heated in a second conversion heat treatment to between 790 and 850° C. for between 1 and 100 hours in a 7.5 percent oxygen atmosphere; (2) the wires were then rolled to a thickness of 0.0066 inches; and (3) the resulting rolled wires were heated in a third conversion heat treatment in a 7.5% oxygen atmosphere at between 790 and 850° C. for between 10 and 100 hours.

If one second phase conversion heat treatment was done after the rolling step, the conversion heat treatment entailed heating the wire to between 790 and 850° C. for between 10 and 100 hours and then 650 and 790° C. for between 10 and 100 hours in a 7.5 percent oxygen atmosphere.

The resulting tapes had fill factors of 33 percent. Pure silver tapes were made by replacing the 0.09 wt. % Al—Ag tube with 99.9% silver tube.

A tape with a pure silver sheath (Wire C), a 1DS tape with an ODS silver sheath (Wire D) were given one more conversion heat treatment, and a tape with an ODS silver sheath (Wire E) was given two more conversion heat treatments. The Je of the tapes were measured.

A maximum in Je is obtained near 2.1 hours of T to O conversion. The ODS sheathed wire consistently has a higher Je. Under the process conditions used in this example, Wire E, prepared by a 2DS process, had a J$_c$ of 34,500 A/cm$^2$ for a 16 meter length.

EXAMPLE 4

A similar process was used to prepare tapes with a higher fill factor. This was accomplished by using a thinner wall silver billet with a copper outer sheath. The silver billet had an outer diameter of 1.045 inches and an inner diameter of 0.846 inches. Copper tube had an outer diameter of 1.235 inches and an inner diameter of 1.060 inches. After drawing, the copper was removed. The multifilament bundles were prepared as described in Example 2, with the exception that wire F had a pure silver sheath applied to the outside of the 0.09 wt % aluminum-silver sheath. Wire H was made using a fine silver sheath only; no aluminum-silver was used. Wire F and wire G were processed according to Example 3 with a total of three conversion heat treatments.

The results of wire drawing and $J_c$ values for wire F and G are shown in Table 4.

TABLE 4

| Wire | Drawing Results | $J_c$ (A/cm$^2$) |
|---|---|---|
| F | Drew to 0.0369 inches | 30,000 |
| G | Drew to 0.0369 inches | 27,000 |
| H | Wire did not draw to 0.0369 inches | |

EXAMPLE 5

A composite wire may be made using procedures described in Example 1, except that the rebundling tube comprised a Ag—Mg alloy with 0.061 wt % Mg dissolved into the Ag matrix. A final Je performance of up to 8000 A/cm$^2$ (77K, self field) may be obtained

EXAMPLE 6

A composite wire was made using procedures described in Example 4, except that a treatment to oxidize the Ag—Al alloy was used immediately prior to the first phase conversion treatment. The conditions of this treatment were 450° C. in 100 percent $O_2$ for 5 hours. The final Jc performance of the wire was 35,400 A/cm$^2$ (77K, self field).

EXAMPLE 7

A composite wire may be made using procedures described in Example 3, except that 7 filaments of a Ag—Al alloy (0.09 wt % Al) were substituted for the central 7 filaments of superconductor. A final Je performance of up to 7000 A/cm$^2$ (77K, self field) may be obtained.

Other embodiments are within the claims.

What is claimed is:

1. A composite superconducting article comprising:
   a plurality of filaments extending along the length of said article, said filaments comprising an oxide superconductor;
   a first constraining material substantially surrounding the plurality of filaments, the first constraining material including a noble metal and a metal oxide, wherein the first constraining material contains less than 0.5 volume percent of said metal oxide; and
   a second constraining material substantially surrounding each of said filaments, said second constraining material being substantially surrounded by said first constraining material,
   wherein the composite superconducting article has Je of at least 7,000 A/cm$^2$ at 77 K, self field.

2. The composite article of claim 1 wherein said filaments have substantially the same critical current density regardless of the location of each filament in said article.

3. The composite superconducting article of claim 1, wherein said noble metal and said second constraining material includes silver, gold, platinum, or palladium, or an alloy thereof and wherein said metal oxide includes a metal including aluminum, magnesium, lithium, sodium, potassium, calcium, beryllium, strontium, barium, yttrium, scandium, lanthanum, cerium, praseodymium, neodymium, promethium, samarium, europium, gadolinium, terbium, dysprosium, holmium, erbium, thulium, ytterbium, lutetium, titanium, zirconium, hafnium, vanadium, niobium, tantalum, silicon, germanium, tin, lead, gallium, indium, thallium, manganese, antimony, manganese, antimony, or zinc.

4. The composite superconducting article of claim 1, wherein said metal oxide includes a metal including aluminum, magnesium, yttrium, zirconium, titanium, hafnium, lithium, manganese, antimony, manganese, antimony, or zinc.

5. The composite superconducting article of claim 1, wherein said first and second constraining materials include silver.

6. The composite superconducting article of claim 1, wherein an outermost constraining material substantially surrounds said first constraining material.

7. The composite superconducting article of claim 1, wherein said outermost constraining material is silver.

8. The composite superconducting article of claim 1, wherein said oxide superconductor is BSCCO-2223, (Bi,Pb)SCCO-2223, BSCCO-2212, or (Bi,Pb)SCCO-2212.

9. The composite superconducting article of claim 1, wherein said article has a tensile strength greater than 50 MPa.

10. The composite superconducting article of claim 1, wherein the first constraining material contains between 0.001 and 0.3 volume percent of said metal oxide.

11. The composite superconducting article of claim 1, wherein the article has a Je of at least 8,000 A/cm$^2$ at 77 K, self-field.

12. The composite superconducting article of claim 1, wherein the amount of said metal oxide in the first constraining material is greater than that in the second constraining material.

13. The composite superconducting article of claim 12, wherein the second constraining material is substantially free of said metal oxide.

14. A composite superconducting article comprising an oxide superconductor substantially surrounded by a first constraining material wherein said first constraining material includes a noble metal and a metal oxide, wherein said metal oxide includes a metal including aluminum, magnesium, sodium, potassium, calcium, strontium, barium, yttrium, scandium, lanthanum, cerium, praseodymium, neodymium, samarium, europium, gadolinium, dysprosium, erbium, ytterbium, lutetium, titanium, zirconium, hafnium, vanadium, niobium, tantalum, silicon, germanium, tin, lead, gallium, indium, thallium, manganese, antimony, or zinc, and the first constraining material contains less than 0.5 volume percent of said metal oxides,
   wherein the composite superconducting article has a Je of at least 7,000 A/cm$^2$ at 77 K, self field.

15. The composite superconducting article of claim 14, wherein said metal oxide of the first constraining layer is dispersed in said noble metal.

16. The composite superconducting article of claim 14, wherein said oxide superconductor is BSCCO-2223, (Bi,Pb)SCCO-2223, BSCCO-2212, or (Bi,Pb)SCCO-2212.

17. The composite superconducting article of claim 14, wherein said article has a tensile strength greater than 50 MPa.

18. The composite superconducting article of claim 14, wherein the first constraining material contains between 0.001 and 0.3 volume percent of said metal oxide.

19. The composite superconducting article of claim 14, wherein said metal oxide includes a metal including aluminum, magnesium, yttrium, zirconium, titanium, hafnium, manganese, antimony, or zinc.

20. The composite superconducting article of claim 14, wherein the article has a Je of at least 8,000 A/cm$^2$ at 77 K, self-field.

21. A composite superconducting article comprising an oxide superconductor substantially surrounded by a matrix including a first constraining material which includes a noble metal and a metal oxide, wherein said matrix contains less than 0.3 volume percent of metal oxide particles including said metal oxides, wherein the composite superconducting article has a Je of at least 7,000 A/cm$^2$ at 77 K, self field.

22. The composite superconducting article of claim 21, wherein said metal oxide is dispersed in said noble metal.

23. The composite superconducting article of claim 21, wherein said oxide superconductor is BSCCO-2223, (Bi,Pb)SCCO-2223, BSCCO-2212, or (Bi,Pb)SCCO-2212.

24. The composite superconducting article of claim 21, wherein said metal oxide of the first constraining material is dispersed in said noble metal.

25. The composite superconducting article of claim 21, wherein said matrix contains at least 0.001 volume percent of said metal oxide particles.

26. The composite superconducting article of claim 21, wherein the article has a Je of at least 8,000 A/cm$^2$ at 77 K, self-field.

27. A composite superconducting article comprising a plurality of filaments including an oxide superconductor, said plurality of filaments substantially surrounded by a first constraining material wherein said first constraining material consists essentially of silver and a metal oxide, wherein said metal oxide is an oxide of aluminum, magnesium, sodium, potassium, calcium, strontium, barium, yttrium, scandium, lanthanum, cerium, praseodymium, neodymium, samarium, europium, gadolinium, dysprosium, erbium, ytterbium, lutetium, titanium, zirconium, hafnium, vanadium, niobium, tantalum, silicon, germanium, tin, lead, gallium, indium, thallium, manganese, antimony, or zinc, and the first constraining material contains less than 0.3 volume percent of said metal oxides, wherein the composite superconducting article has a Je of at least 7,000 A/cm$^2$ at 77 K, self field.

28. The composite superconducting article of claim 27, wherein the article has a Je of at least 8,000 A/cm$^2$ at 77 K, self-field.

29. The composite superconducting article of claim 27, wherein said oxide superconductor is BSCCO-2223, (Bi,Pb)SCCO-2223, BSCCO-2212, or (Bi,Pb)SCCO-2212.

\* \* \* \* \*

UNITED STATES PATENT AND TRADEMARK OFFICE
CERTIFICATE OF CORRECTION

PATENT NO. : 6,305,070 B1
DATED : October 23, 2001
INVENTOR(S) : Peter R. Roberts et al.

It is certified that error appears in the above-identified patent and that said Letters Patent is hereby corrected as shown below:

Column 1,
Line 23, insert -- . -- after "Bi, Pb)SCCO"

Column 3,
Line 27, insert -- . -- after "deformation"

Column 4,
Line 4, insert -- . -- after "metal"

Column 8,
Line 59, insert -- , -- between "tin" and "lead"

Column 11,
Line 56, insert -- . -- after "atmosphere"

Column 12,
Line 60, change "," to -- . --

Column 16,
Line 12, "claim 1" should be -- claim 6 --
Line 44, change "oxides" to -- oxide --

Column 17,
Line 4, change "oxides" to -- oxide --

UNITED STATES PATENT AND TRADEMARK OFFICE
CERTIFICATE OF CORRECTION

PATENT NO. : 6,305,070 B1
DATED : October 23, 2001
INVENTOR(S) : Peter R. Roberts et al.

It is certified that error appears in the above-identified patent and that said Letters Patent is hereby corrected as shown below:

<u>Column 18,</u>
Line 12, change "oxides" to -- oxide --

Signed and Sealed this

Twentieth Day of May, 2003

JAMES E. ROGAN
*Director of the United States Patent and Trademark Office*